United States Patent
Takeshita

(10) Patent No.: US 9,766,548 B2
(45) Date of Patent: Sep. 19, 2017

(54) EXPOSURE APPARATUS, EXPOSURE METHOD, AND METHOD OF MANUFACTURING ARTICLE

(71) Applicant: CANON KABUSHIKI KAISHA, Tokyo (JP)

(72) Inventor: Bunsuke Takeshita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 312 days.

(21) Appl. No.: 13/916,828

(22) Filed: Jun. 13, 2013

(65) Prior Publication Data

US 2013/0342819 A1 Dec. 26, 2013

(30) Foreign Application Priority Data

Jun. 22, 2012 (JP) .................................. 2012-141468

(51) Int. Cl.
G03F 7/20 (2006.01)

(52) U.S. Cl.
CPC ...... G03F 7/70141 (2013.01); G03F 7/70616 (2013.01)

(58) Field of Classification Search
CPC .. G03F 7/70141; G03F 7/70616; G03F 7/705; G03F 7/70591; G03F 7/706
See application file for complete search history.

(56) References Cited

U.S. PATENT DOCUMENTS

| 4,506,977 | A | 3/1985 | Sato et al. |
| 6,088,082 | A | 7/2000 | Yonekawa |
| 7,921,383 | B1* | 4/2011 | Wei ................................. 716/54 |
| 7,952,683 | B2 | 5/2011 | Amano |
| 2002/0036758 | A1* | 3/2002 | de Mol et al. .................. 355/53 |
| 2006/0008716 | A1* | 1/2006 | Jeunink et al. ................. 430/30 |

(Continued)

FOREIGN PATENT DOCUMENTS

| JP | 63058349 A | 3/1988 |
| JP | 63016725 B | 4/1988 |

(Continued)

OTHER PUBLICATIONS

Office Action issued in Japanese Application No. JP2012141468 mailed Jun. 6, 2016.

*Primary Examiner* — Steven H Whitesell Gordon
(74) *Attorney, Agent, or Firm* — Rossi, Kimms & McDowell LLP

(57) ABSTRACT

The present invention provides an exposure apparatus including a projection optical system configured to project light from a reticle onto a substrate, a processor configured to estimate a variation in imaging characteristic of the projection optical system, based on a model determined in advance, and an adjusting device configured to adjust the imaging characteristic of the projection optical system based on the variation estimated by the processor, wherein the processor is configured, if an error of the imaging characteristic of the projection optical system adjusted by the adjusting device based on the variation which is estimated based on a first number of models, for estimating the variation, determined in advance without the reticle, does not fall within a tolerance, to generate a second number of models for estimating the variation, the second number being larger than the first number.

29 Claims, 4 Drawing Sheets

(56) References Cited

U.S. PATENT DOCUMENTS

| | | | |
|---|---|---|---|
| 2006/0114437 A1* | 6/2006 | Akhssay et al. | 355/55 |
| 2009/0296055 A1* | 12/2009 | Ye et al. | 355/30 |
| 2009/0300573 A1* | 12/2009 | Cao et al. | 716/19 |
| 2012/0229385 A1* | 9/2012 | Fu | G06F 3/0346 345/163 |

FOREIGN PATENT DOCUMENTS

| | | |
|---|---|---|
| JP | H10199782 A | 7/1998 |
| JP | H11258498 A | 9/1999 |
| JP | 11317354 A | 11/1999 |
| JP | 2008066639 A | 3/2008 |

\* cited by examiner ated heat. Such variations in imaging characteristic of the projection optical system are called a heat aberration or an exposure aberration, and lead to degradation in overlay accuracy. Under the circumstance, Japanese Patent Publication No. 63-16725 and Japanese Patent Laid-Open Nos. 11-317354 and 63-58349 propose techniques for compensating for variations in imaging characteristic of a projection optical system (to be referred to as an "exposure aberration" hereinafter) as exposure light is guided to the projection optical system.

Japanese Patent Publication No. 63-16725 discloses a technique of calculating an exposure aberration in accordance with a model equation (to be also simply referred to as a model hereinafter) which uses, for example, the amount of exposure, the exposure time, or the non-exposure time as variables, and adjusting (correcting) the imaging characteristics of the projection optical system based on the calculation result. This model equation has a coefficient unique to the projection optical system for each imaging characteristic, and the coefficient changes depending on the illumination shape (effective light source shape) used to illuminate a reticle, or the pattern shape of the reticle. The model equation (coefficient) depends on the effective light source shape because the position through which exposure light passes in the projection optical system changes depending on the effective light source shape formed by an illumination optical system. On the other hand, the model equation depends on the pattern shape of the reticle because the diffraction direction of light (diffracted light) diffracted by the pattern changes depending on the pattern pitch, so the position through which the diffracted light passes in the projection optical system and its periphery also changes.

Also, Japanese Patent Laid-Open Nos. 11-317354 and 63-58349 propose techniques of obtaining a model equation (coefficient) for each effective light source shape or each pattern shape of a reticle. Japanese Patent Laid-Open No. 11-317354 discloses a method of obtaining, in advance, a correlation table between the effective light source shape and the model equation coefficient before an exposure apparatus is used. Japanese Patent Laid-Open No. 63-58349 discloses a method of performing exposure (actual exposure) while correcting the exposure aberration using the above-mentioned model equation, and detecting a correction error of the exposure aberration to correct (fine correction) the model equation coefficient.

Unfortunately, it is difficult for the conventional techniques to efficiently obtain a model equation that can be used to calculate the exposure aberration in actual exposure, leading to considerable degradation in performance (for example, overlay accuracy) of the exposure apparatus due to the exposure aberration. In Japanese Patent Publication No. 63-16725 and Japanese Patent Laid-Open No. 11-317354, the pattern shape of the reticle is not taken into consideration in obtaining a model equation (coefficient), so the exposure aberration in actual exposure cannot be obtained with high accuracy even when a model equation is used. On the other hand, in Japanese Patent Laid-Open No. 63-58349, a model equation can be obtained in consideration of the effective light source shape and the pattern shape of the reticle. However, because it takes a long time to obtain such a model equation, it is impractical to obtain model equations for all effective light source shapes and all pattern shapes of reticles used in the exposure apparatus.

SUMMARY OF THE INVENTION

The present invention provides, for example, a technique advantageous in terms of achieving both precision of estimating variations in imaging characteristic of an exposure apparatus, and efficient determination of a model for the estimation.

According to one aspect of the present invention, there is provided an exposure apparatus which exposes a substrate to light, the apparatus including a projection optical system configured to project light from a reticle onto the substrate, a processor configured to estimate a variation in imaging characteristic of the projection optical system, based on a model determined in advance, and an adjusting device configured to adjust the imaging characteristic of the projection optical system based on the variation estimated by the processor, wherein the processor is configured, if an error of the imaging characteristic of the projection optical system adjusted by the adjusting device based on the variation which is estimated based on a first number of models, for estimating the variation, determined in advance without the reticle, does not fall within a tolerance, to generate a second number of models for estimating the variation, the second number being larger than the first number.

Further features of the present invention will become apparent from the following description of exemplary embodiments with reference to the attached drawings.

DESCRIPTION OF THE EMBODIMENTS

Figure 1:
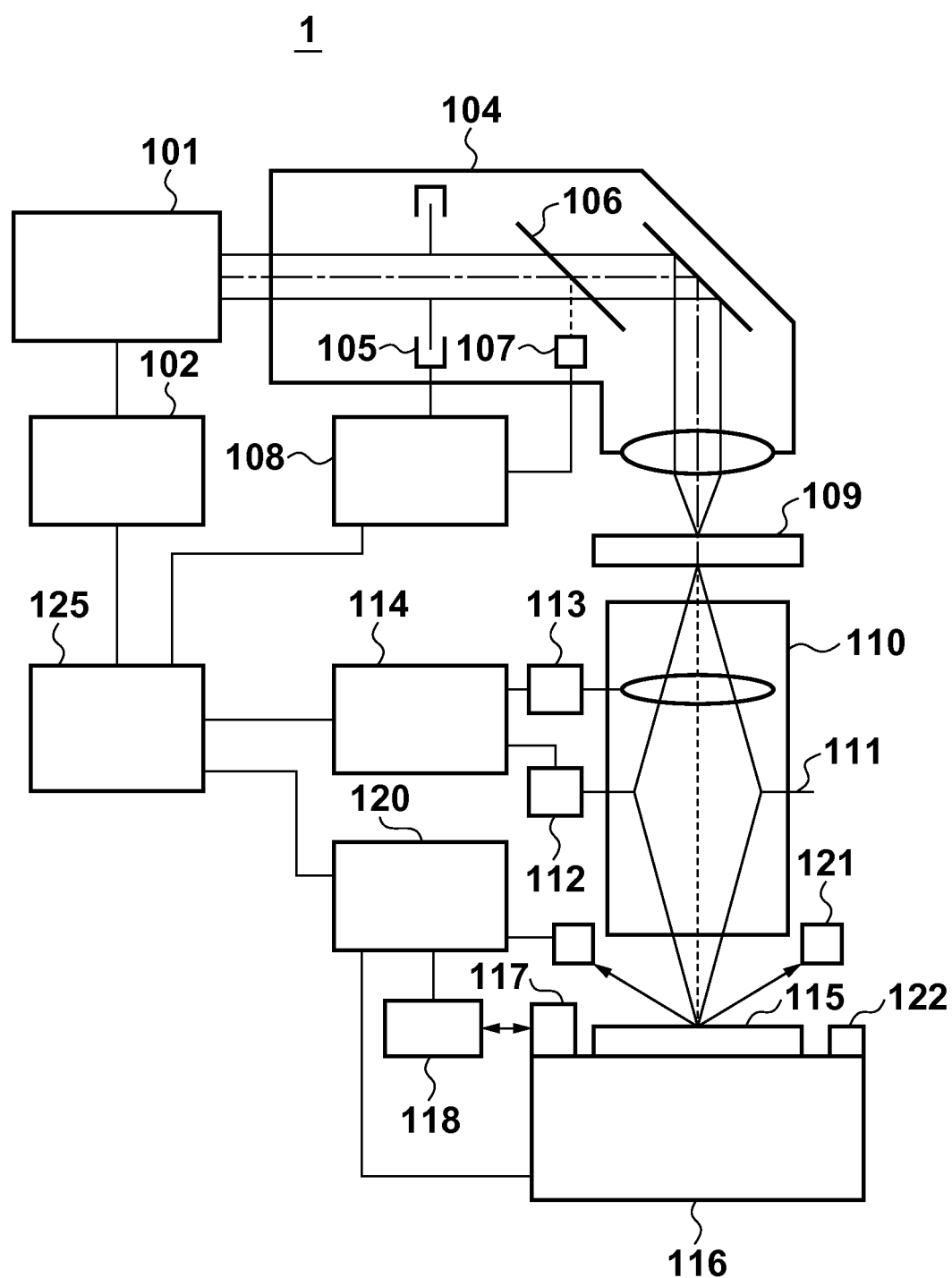
FIG. 1 is a schematic view showing the configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the configuration of an exposure apparatus 1 according to an aspect of the present invention. The exposure apparatus 1 serves as a lithography apparatus which exposes a substrate to light and, more specifically, transfers the pattern of a reticle (mask) onto a substrate using the step-and-scan scheme. However, the exposure apparatus 1 can adopt the step-and-repeat scheme or another exposure scheme.

The exposure apparatus 1 includes an illumination optical system 104 which illuminates a reticle 109 with light from a light source unit 101, a projection optical system 110, and a substrate stage 116 which moves upon holding a substrate 115. The exposure apparatus 1 also includes a lens driving unit 112, aperture driving unit 113, laser interferometer 118, focus detection system 121, and detection unit 122. The exposure apparatus 1 moreover includes a light source control unit 102, illumination control unit 108, projection control unit 114, stage control unit 120, and main control unit 125.

The light source unit 101 includes a pulsed light source filled with a gas such as KrF or ArF, and emits light in the far-ultraviolet range with a wavelength of about 248 nm. The light source unit 101 also includes, for example, a narrow-band module, monitor module, and shutter. The narrow-band module is formed by, for example, a front mirror which constitutes a resonator, and a diffraction grating and prism for narrowing the wavelength (exposure wavelength) band, and the monitor module is formed by, for example, a spectroscope and detector for monitoring the wavelength stability and spectral width.

The light source control unit 102 controls, for example, a gas exchange operation in the light source unit 101, a wavelength stabilization operation for light emitted by the light source unit 101, and a discharge application voltage in the light source unit 101. In this embodiment, the light source control unit 102 controls the light source unit 101 not independently but under the control of the main control unit 125.

Light emitted by the light source unit 101 enters the illumination optical system 104. The light incident on the illumination optical system 104 is shaped into a predetermined beam shape through a beam shaping optical system (not shown), and enters an optical integrator (not shown). The optical integrator forms a large number of secondary light sources to illuminate the reticle 109 with a uniform illuminance distribution.

An aperture stop 105 included in the illumination optical system 104 has an almost circular aperture portion. The illumination control unit 108 controls each unit of the illumination optical system 104 under the control of the main control unit 125, so that the diameter of the aperture portion of the aperture stop 105, or the numerical aperture (NA) of the illumination optical system 104 has a predetermined value. Since the value of the ratio of the numerical aperture (NA) of the projection optical system 110 to that of the illumination optical system 104 is a coherence factor (G value), the illumination control unit 108 can adjust (set) the G value by controlling the diameter of the aperture portion of the aperture stop 105.

A half mirror 106 for partially reflecting (extracting) light that illuminates the reticle 109 is arranged in the optical path of the illumination optical system 104. An ultraviolet photosensor 107 is arranged in the optical path of light reflected by the half mirror 106. The photosensor 107 generates an output corresponding to the intensity (that is, the exposure energy) of light that illuminates the reticle 109. The output from the photosensor 107 is converted into an exposure energy per pulse by an integration circuit (not shown) which performs integration for each pulse emission of the light source unit 101, and is input to the main control unit 125 via the illumination control unit 108.

The reticle 109 is an original having a pattern (circuit pattern) to be transferred onto the substrate 115, and is held by a reticle stage (not shown). The reticle stage holds the reticle 109, and moves in the three-dimensional directions (in the optical axis direction of the projection optical system 110, and within a plane perpendicular to the optical axis) using, for example, a linear motor. Since the exposure apparatus 1 is a step-and-scan exposure apparatus, it transfers the pattern of the reticle 109 onto the substrate 115 by scanning them.

The projection optical system 110 includes a plurality of optical elements (for example, lenses), reduces the pattern of the reticle 109 to a predetermined reduction magnification $\beta$ (for example, $\beta=\frac{1}{4}$), and projects it onto the substrate 115 (a shot region defined on it).

An aperture stop 111 having an almost circular aperture portion is arranged on the pupil plane of the projection optical system 110 (a Fourier transform plane for the reticle 109). The aperture driving unit 113 includes, for example, a motor, and drives the aperture stop 111 so that the diameter of the aperture portion of the aperture stop 111 has a predetermined value. Also, the lens driving unit 112 drives optical elements which constitute the projection optical system 110, that is, some of lenses in this embodiment using, for example, an air pressure or a piezoelectric element. The projection control unit 114 controls the lens driving unit 112 and aperture driving unit 113 under the control of the main control unit 125. In this embodiment, by driving lenses which constitute the projection optical system 110, the variations in various aberrations of the projection optical system 110 are reduced to, in turn, reduce distortion while maintaining the magnification (projection magnification) at a satisfactory value.

The substrate 115 is a substrate onto which the pattern of the reticle 109 is projected (transferred). The substrate 115 is coated with a photoresist (photosensitive agent). The substrate 115 includes a wafer, glass plate, and other substrates.

The substrate stage 116 holds the substrate 115, and moves in the three-dimensional directions (in the optical axis direction of the projection optical system 110, and within a plane perpendicular to the optical axis) using, for example, a linear motor. The distance to a moving mirror 117 fixed to the substrate stage 116 is measured by the laser interferometer 118 to detect the position of the substrate stage 116 within the plane perpendicular to the optical axis of the projection optical system 110. The stage control unit 120 controls the position of the substrate stage 116 under the control of the main control unit 125, based on the detection result obtained by the laser interferometer 118 (for example, moves the substrate stage 116 to a predetermined position).

The focus detection system 121 includes a light-projecting optical system and detection optical system, and detects the position of the substrate 115 in the optical axis direction of the projection optical system 110 (that is, the height of the surface of the substrate 115). The light-projecting optical system projects light (non-exposure light), to which a photoresist applied onto the substrate 115 is not exposed, to focus the light on each position upon the substrate 115. The light reflected by the substrate 115 at each position enters the detection optical system. In the detection optical system, a plurality of light-receiving elements for position detection are arranged in correspondence with light beams reflected by the substrate 115 at the respective positions. More specifically, a plurality of light-receiving elements are arranged so that the light-receiving surface of each light-receiving element is nearly conjugate to a reflecting point on the substrate 115 through an imaging optical system. Therefore, a position shift of the substrate 115 in the optical axis direction of the projection optical system 110 is detected as that of light incident on each light-receiving element arranged in the detection optical system.

The detection unit 122 is arranged on the image plane side of the projection optical system 110, that is, on the substrate stage 116 in this embodiment, and detects light having passed through the projection optical system 110. The detection unit 122 includes, for example, a light-shielding plate having a pinhole which passes light from the projection optical system 110, and a photoelectric conversion element which detects the light having passed through the pinhole.

The main control unit 125 includes, for example, a CPU and memory, and controls the overall exposure apparatus 1 (each unit of the exposure apparatus 1) via, for example, the light source control unit 102, illumination control unit 108, projection control unit 114, and stage control unit 120. In this embodiment, the main control unit 125 functions as a processing unit which performs a process of generating a model equation used to estimate variations in imaging characteristic of the projection optical system 110. Note that the model equation may take a form (for example, a table indicating the relationship between the input value and the output value) other than an "equation" as long as a value close to that obtained by the equation can be obtained, and they will be generically referred to as a model hereinafter. The main control unit 125 also performs a process of calculating variations in imaging characteristic of the projection optical system 110 in accordance with the model equation.

Variations in imaging characteristic of the projection optical system 110 will be described herein. In this embodiment, the imaging characteristics of the projection optical system 110 include at least one of the focus, magnification, distortion, astigmatism, spherical aberration, coma aberration, and wavefront aberration. Also, the wavefront aberration can be represented as each term of a function obtained by expanding the wavefront shape using Zernike polynomials, as is well known to those skilled in the art. These terms are also sometimes generically called "aberrations".

Figure 2:
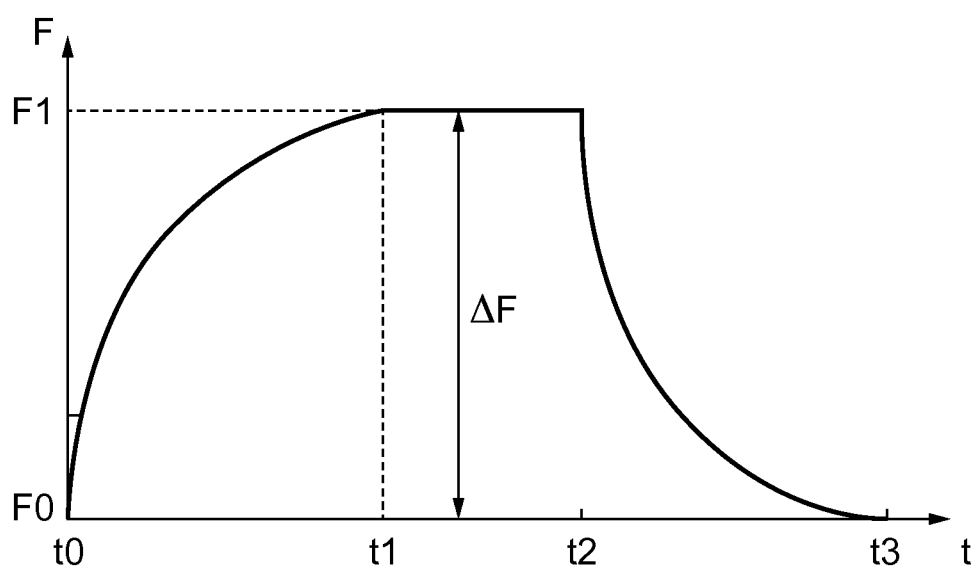
FIG. 2 is a graph illustrating an example of variations in aberration of a projection optical system of the exposure apparatus shown in FIG. 1.

FIG. 2 is a graph illustrating an example of variations (temporal changes) in aberration of the projection optical system 110. FIG. 2 shows time t on the abscissa, and an amount of aberration F at a given image height in the projection optical system 110 on the ordinate. Also, the amount of aberration of the projection optical system 110 in the initial state (that is, before exposure) is defined as F0.

Referring to FIG. 2, when exposure starts from time t0, the aberration varies with time and becomes stable upon reaching a predetermined amount of aberration F1 at time t1. At time t1 and subsequent times, even when light (exposure light) enters the projection optical system 110, the aberration remains unchanged from F1 because thermal energy absorbed in the projection optical system 110 and that released from the projection optical system 110 have reached an equilibrium. When exposure ends at time t2, the aberration returns to the initial state with time and reaches the initial amount of aberration F0 at time t3. When exposure stops at time t2, the focus returns to the initial state with time, and reaches the initial amount of aberration F0 at time t3. An amount of variation ΔF in aberration from F0 to F1 generally varies for each image height of the projection optical system 110.

Modeling of variations in aberration of the projection optical system 110 shown in FIG. 2 will be described. Note that modeling corresponds to generation of an approximation model equation representing variations in aberration of the projection optical system 110. An amount of aberration F(t) of the projection optical system 110 at time t is expressed as the sum of N terms as per:

$$F(t) = \sum_{i=1}^{N} F_i(t) \tag{1}$$

where N is the number of models, and the subscript "i" is the model number.

$F_i(t)$ in equation (1) can be represented using an amount of aberration $F_i(t-\Delta t)$ of the ith model before a time $\Delta t$, and a time constant $T_i$ for each model (the time constant $T_i$ is equivalent to that of the heat transfer characteristics of the projection optical system 110), as per:

$$F_i(t) = F_i(t-\Delta t) \times \exp(-\Delta t/T_i) + F1_i \times (1-\exp(-\Delta t/T_i)) \tag{2}$$

where $F1_i$ is the amount of aberration of each model in a thermal equilibrium state, and can be represented using an amount of variation $K_i$ of the aberration per unit light amount (unit exposure energy), and a parameter Q representing the conditions to determine the exposure energy in actual exposure (note that the conditions to determine the exposure energy include, for example, the exposure time, amount of exposure, scanning speed, and exposure region information), as per:

$$F1_i = K_i \times Q \tag{3}$$

As can also be understood from equation (1), $F1_i$ satisfies:

$$F1 = \sum_{i=1}^{N} F1_i \tag{4}$$

Variations in aberration of the projection optical system 110 are expressed as the sum of time constant terms in equations (1) and (2) for the following reason. Respective lenses which constitute the projection optical system 110 generally have different sizes, masses, and heat capacities, so variations in aberration in exposure cannot be represented using only one time constant, but can be represented using the sum of a plurality of time constant terms. Note that variations in aberration when exposure has not been done for a time Δt can be represented using an equation in which $F1_i$ in equation (2) is zero.

Variations in aberration of the projection optical system 110 shown in FIG. 2 (a curve shown in FIG. 2) are modeled using $K_i$, Q, and $T_i$ as parameters in accordance with equations (1), (2), and (3). However, equations (1), (2), and (3) are merely an example in this embodiment, and modeling may be done using other equations.

To adjust the variations in aberration of the projection optical system 110 with high accuracy, the amount of variation (correction coefficient) $K_i$ of the aberration per unit light amount must be obtained for each exposure condition. This is because upon a change in exposure condition, the energy density distribution of light incident on the projection optical system 110 changes, so the amount of variation in aberration of the projection optical system 110, and its image height dependence also change. Note that the exposure conditions include, for example, the shape of light that illuminates the reticle 109 (effective light source shape (illumination condition)), the shape of the pattern of the reticle 109, and the region (illumination region) where the reticle 109 is illuminated.

Figure 3:
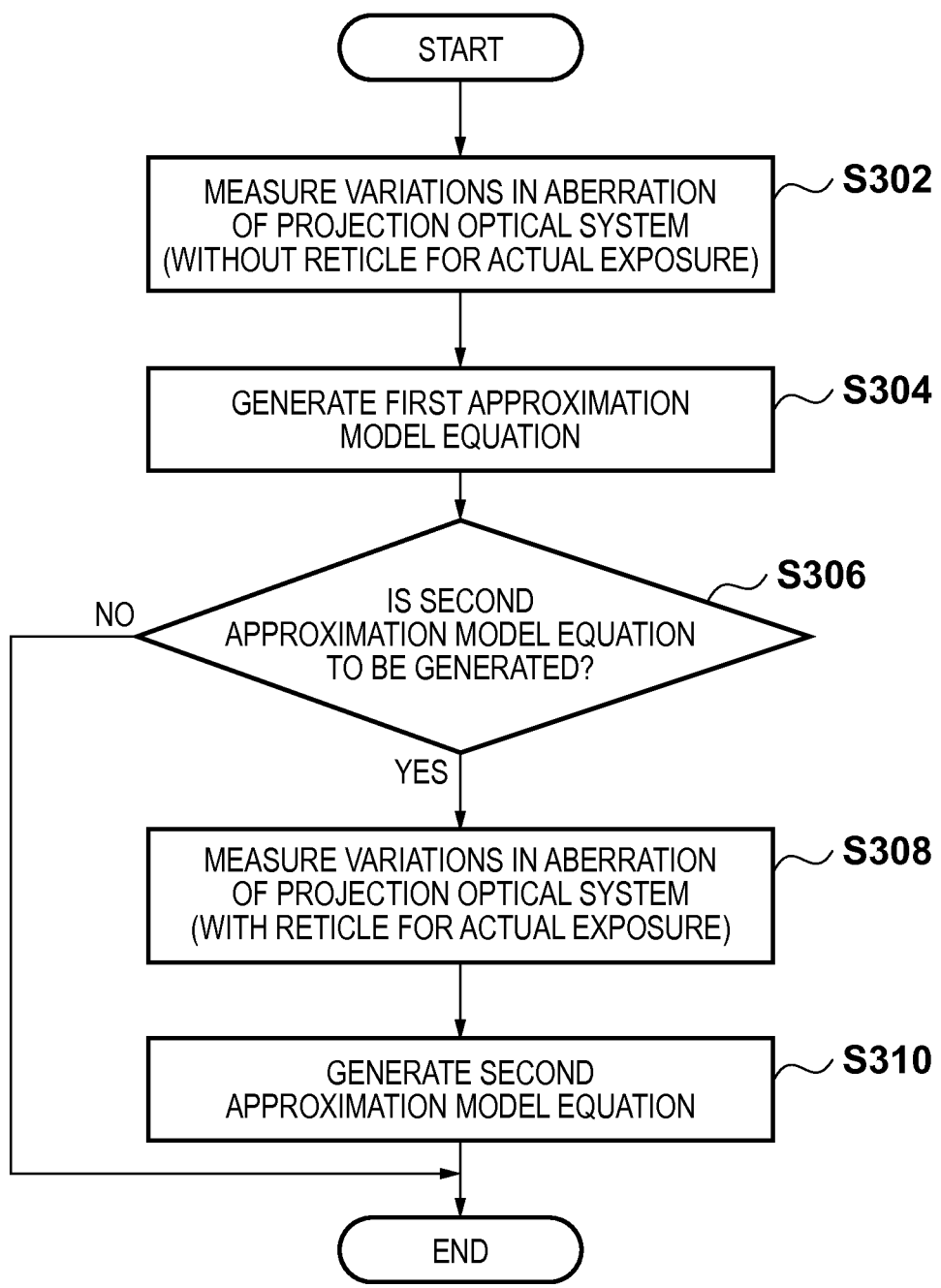
FIG. 3 is a flowchart for explaining a process of generating an approximation model equation representing variations in imaging characteristic of the projection optical system of the exposure apparatus shown in FIG. 1.

A process of generating an approximation model equation representing variations in imaging characteristic of the projection optical system 110 in this embodiment will be described with reference to FIG. 3. This process is performed by making the main control unit 125 execute overall control of each unit of the exposure apparatus 1, as described above.

In step S302, an arbitrary effective light source shape is formed by the illumination optical system 104, and light having passed through the projection optical system 110 is detected by the detection unit 122 to measure variations in aberration of the projection optical system 110. At this time, no reticle (actual exposure reticle) 109 used in actual exposure is arranged on the object plane of the projection optical system 110 (that is, the reticle 109 is removed from the optical path). However, in place of the reticle 109, a glass plate having no pattern, or that having a pattern with a large pitch may be arranged on the object plane of the projection optical system 110. This is to eliminate the influence of light (diffracted light) diffracted by the pattern of the reticle 109 so as to obtain data which depends on an effective light source shape formed by the illumination optical system 104.

In step S304, a first approximation model equation (a first number of models) representing variations in aberration of the projection optical system 110 is generated based on the measurement result obtained in step S302. Since the first approximation model equation is generated from the measurement result obtained when no reticle 109 used in actual exposure is arranged on the object plane of the projection optical system 110, it represents variations in aberration of the projection optical system 110, which depend on the shape of light that illuminates the reticle 109.

Hence, a set of steps S302 and S304 is a process in which light which enters the projection optical system 110 without the mediacy of the reticle 109, and passes through the projection optical system 110 is detected by the detection unit 122 to generate a first approximation model based on the detection result.

Figure 4:
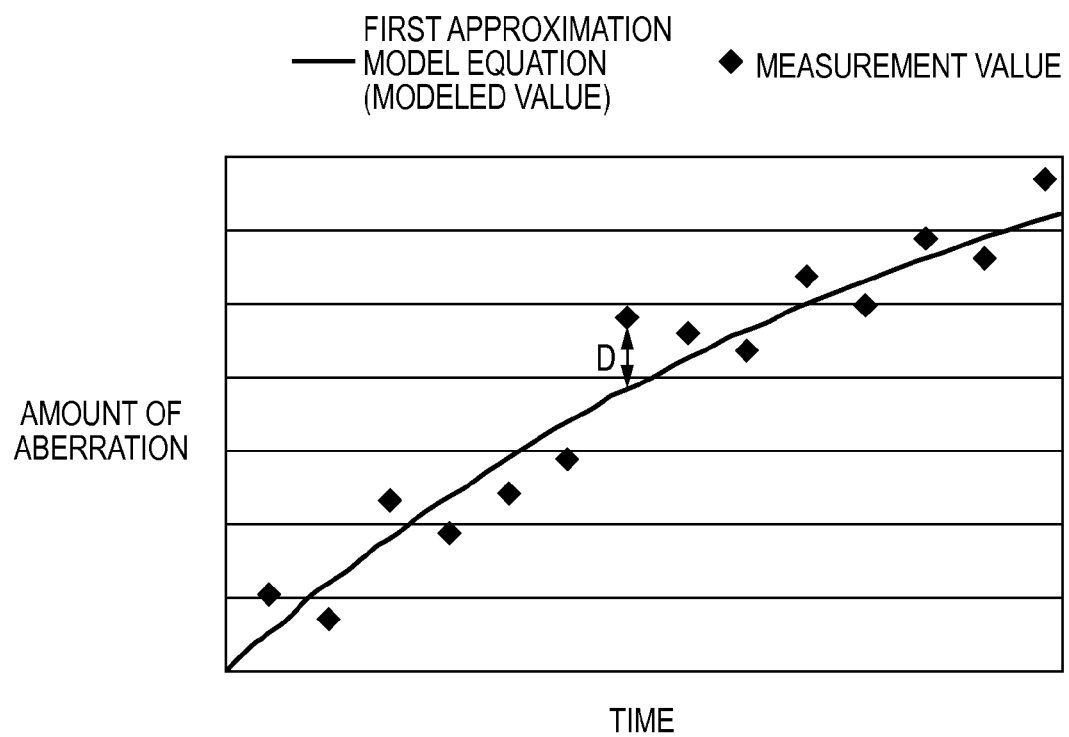
FIG. 4 is a graph illustrating an example of variations in aberration of the projection optical system, which are measured in step S302 of the flowchart shown in FIG. 3.

Steps S302 and S304 will be described in more detail. In, for example, step S302, a result (measurement value) shown in FIG. 4 is obtained as variations in aberration of the projection optical system 110. FIG. 4 shows time on the abscissa, and the amount of aberration of the projection optical system 110 on the ordinate. In step S304, a first approximation model equation, that is, a correction coefficient $K_i$ which can optimally approximate the measurement value shown in FIG. 4 is determined using equations (1), (2), and (3). At this time, an error of aberration measurement is more likely to have an influence if the number of models N is too large, while variations in aberration cannot be represented satisfactorily if the number of models N is too small, so it is necessary to provide an optimum number of models. In this embodiment, the number of models N is 2, and the time constant $T_i$ is, for example, $T_1$=5000 [sec] and $T_2$=350 sec. However, the number of models N may be changed in accordance with the accuracy required to adjust the aberration measurement error and aberration, or the time constant $T_i$ may be changed for each aberration in accordance with the distribution of the measurement value. Note that $K_i$ is determined so that the sum of the sum of squares values, at respective times, of a difference D between the measurement value and the value obtained by modeling the measurement value using equations (1), (2), and (3) minimizes. Also, in determining $K_i$, an optimization method such as the Downhill Simplex Method may also be used.

For a plurality of effective light source shapes, steps S302 and S304 are executed to generate a first approximation model equation ($K_i$), and obtain a table for obtaining $K_i$ in accordance with a product $NA_{ill}$ between the NA of the projection optical system 110 and the σ value of the illumination optical system 104 based on the generation result.

More specifically, $K_i$ ($K_{i1}$, $K_{i2}$, and $K_{i3}$) is obtained for three effective light source shapes (NA×σ is $NA_{ill1}$, $NA_{ill2}$, and $NA_{ill3}$), as described above. On the other hand, $K_i$ for arbitrary $NA_{ill}$ is represented using parameters A, B, and C, as per:

$$K_i = A \times NA_{ill}^2 + B \times NA_{ill} + C \quad (5)$$

When correction coefficients for the three effective light source shapes obtained from equation (5) are defined as $K_{i1}'$, $K_{i2}'$, and $K_{i3}'$, the parameters A, B, and C are determined to satisfy $K_{i1}'=K_{i1}$, $K_{i2}'=K_{i2}$, and $K_{i3}'=K_{i3}$.

With such a table, a first approximation model equation (correction coefficient) can be obtained in the stage in which an effective light source shape is determined in actual exposure. However, as described above, a first approximation model equation does not reflect the influence of light diffracted by the reticle 109, so variations in aberration of the projection optical system 110 in actual exposure cannot be obtained with high accuracy. Alternatively, without such a table, a first approximation model equation (correction coefficient) may be obtained in advance for each effective light source shape expected to be used in the exposure apparatus 1.

In step S306, it is determined whether a second approximation model equation (a second number of models) is to be generated, based on the exposure conditions including the pattern of the reticle 109 used in actual exposure, or the detection result obtained by the detection unit 122 in step S302 (that is, the variations in aberration of the projection optical system 110). When no second approximation model equation is generated, a process of generating an approximation model equation representing variations in aberration of the projection optical system 110 ends. In this case, to adjust (correct) the aberration of the projection optical system 110 in actual exposure, variations in aberration of the projection optical system 110 are calculated in accordance with the first approximation model equation. This is done to generate a second approximation model equation so as to prevent too much prolongation of the downtime or adjustment time, when the influence of light diffracted by the reticle 109 is negligible. If, for example, the aberration of the projection optical system 110 can be sufficiently corrected based on the variations in aberration of the projection optical system 110 calculated in accordance with the first approximation model equation, or a layer which requires a relatively low accuracy is to be formed, a second approximation model equation need not always be generated. However, if a second approximation model equation is to be generated, the process proceeds to step S308. In other words, if the errors of the imaging characteristics of the projection optical system 110, which are adjusted based on the variations in aberration of the projection optical system 110 obtained from the first approximation model equation, do not fall within tolerances, a second approximation model needs to be generated.

In step S308, the reticle 109 used in actual exposure is arranged on the object plane of the projection optical system 110, a predetermined effective light source shape is formed by the illumination optical system 104, and light having passed through the projection optical system 110 is detected by the detection unit 122 to measure variations in aberration of the projection optical system 110. This measurement operation is performed in, for example, actual exposure at a time interval (for example, for each substrate) determined in advance in a period (for example, 50 substrates) determined in advance. The time interval and period depend on the required aberration correction accuracy and error measurement accuracy, and therefore may be changed as needed. Also, in step S308, the projection optical system 110 may be adjusted to reduce the variations in aberration of the projection optical system 110 calculated in accordance with the first approximation model equation generated in step S304. In this case, the amount of aberration adjusted in measurement is added to the measured amount of aberration of the projection optical system 110 to obtain data corresponding to the variations in aberration of the projection optical system 110.

In step S310, a second approximation model equation representing variations in aberration of the projection optical system 110 is generated from the measurement result obtained in step S308. The second approximation model equation is generated based on the measurement result obtained when the reticle 109 used in actual exposure is arranged on the object plane of the projection optical system 110. Therefore, the second approximation model equation represents variations in aberration of the projection optical system 110, which depend on the shape of light that illuminates the reticle 109, the shape of the pattern of the reticle 109, and each position on the reticle 109.

Hence, a set of steps S308 and S310 is a process (second process) in which light which enters the projection optical system 110 through the reticle 109 and passes through the projection optical system 110 is detected by the detection unit 122 to generate a second approximation model based on the detection result. More specifically, as in step S304, a second approximation model equation, that is, a correction coefficient which can optimally approximate the measurement value obtained in step S308 is determined using equations (1), (2), and (3). However, in this case, due to the influence of light diffracted by the reticle 109, models in a number (the number of variables included in the first approximation model equation) equal to those in the first approximation model equation are insufficient to represent variations in aberration of the projection optical system 110. Therefore, in this embodiment, the number of models N in the second approximation model equation is 3, and the time constant $T_i$ is, for example, $T_1=5000$ [sec], $T_2=350$ [sec], and $T_3=1200$ [sec]. However, the number of models for the second approximation model equation need only be larger than the number of models for the first approximation model equation, and may be changed in accordance with the accuracy required to adjust the aberration measurement error and aberration. Also, the time constant $T_i$ may be changed for each aberration in accordance with the distribution of the measurement value. Note that after steps S308 and S310, to adjust (correct) the aberration of the projection optical system 110 in actual exposure, variations in aberration of the projection optical system 110 are calculated in accordance with the second approximation model equation.

The reason why the number of models for the second approximation model equation (the number of variables included in the second approximation model equation) is set larger than the number of models for the first approximation model equation (the number of variables included in the first approximation model equation) will be explained herein. In the state where no light is diffracted by the reticle 109 (in the stage in which a first approximation model equation is generated), light from the illumination optical system 104 enters only optical elements (lenses) which constitute the projection optical system 110. Therefore, variations in aberration of the projection optical system 110 occur due to changes in shape, refractive index, and temperature of the optical elements. On the other hand, in the state where light is diffracted by the reticle 109 (in the stage in which a second approximation model equation is generated), light from the illumination optical system 104 enters not only optical elements which constitute the projection optical system 110, but also, for example, a holding member which holds the optical elements. With this arrangement, variations in aberration of the projection optical system 110 occur due to the influences of both changes in orientation of the optical elements upon deformation of the holding member, and changes in shape and refractive index of the optical elements upon heat transfer from the holding member to the optical elements.

In this manner, in the state where light is diffracted by the reticle 109, an aberration generation mechanism (in general, variations in aberration with different time constants) which is absent in the state where no light is diffracted by the reticle 109 acts. Hence, to represent variations in aberration of the projection optical system 110 in actual exposure, it is necessary to use models for the second approximation model equation larger in number than models for the first approximation model equation.

Adjustment (correction) of the aberration of the projection optical system 110 in actual exposure using the first or second approximation model equation will be described. First, a parameter Q representing the conditions (for example, the exposure time, amount of exposure, scanning speed, and exposure region information) in which the exposure energy in actual exposure is determined is determined. Then, a maximum amount of variation of the aberration (the amount of aberration in a thermal equilibrium state) $F1_i$ of the projection optical system 110 is calculated using equation (3) based on $K_i$ corresponding to the parameter Q, and the exposure conditions including the effective light source shape and the shape of the pattern of the reticle 109. An amount of aberration F(t) at time t is calculated in real time in accordance with a recursion relation defined by equations (1) and (2) while actually exposing the substrate 115 to light. Such a calculation process is executed by the main control unit 125, as described above.

The main control unit 125 adjusts the projection optical system 110 through the projection control unit 114 to reduce the calculated amount of aberration (that is, the variations in aberration of the projection optical system 110). The adjustment of the projection optical system 110 includes, for example, driving of lenses which constitute the projection optical system 110 by the lens driving unit 112. Hence, the main control unit 125, projection control unit 114, and lens driving unit 112 function as an adjusting unit which adjusts the projection optical system 110 to reduce the variations in aberration of the projection optical system 110 calculated in accordance with an approximation model equation. However, the operation of reducing the variations in aberration of the projection optical system 110 is not limited to driving of lenses which constitute the projection optical system 110. The variations in aberration of the projection optical system 110 may be reduced by, for example, driving of a reticle stage which holds the reticle 109, driving of the substrate stage 116, or setting of the wavelength of light emitted by the light source unit 101. By generating an approximation model equation for each image height of the projection optical system 110, variations in aberration of the projection optical system 110 at an arbitrary image height can be calculated to adjust the aberration for each image height.

Also, although measurement of variations in aberration of the projection optical system 110 in consideration of light diffracted by the reticle 109 (step S308) is performed in actual exposure in this embodiment, the present invention is not limited to this. Variations in aberration of the projection optical system 110 may be measured in consideration of light, diffracted by the reticle 109, using, for example, an object with a reflectance to exposure light, which is almost equal to that of the substrate 115, in place of the substrate 115 coated with the photoresist. In this case, since a second approximation model equation is generated before actual exposure, the variations in aberration of the projection optical system 110 can be reduced with high accuracy using the second approximation model equation in actual exposure. However, the downtime to generate a second approximation model equation is required before actual exposure.

Also, in this embodiment, at least a first process of generating a first approximation model equation is executed, and then it is determined whether a second process of generating a second approximation model equation is to be executed. However, if it is known in advance whether a second approximation model equation needs to be generated, a second process may be executed without a first process. In this manner, a mode, in which at least one of a first process of generating a first approximation model equation, and a second process of generating a second approximation model equation is selected in accordance with, for example, a user instruction, constitutes one aspect of the present invention.

With this arrangement, the exposure apparatus 1 according to this embodiment generates only a first approximation model equation or both first and second approximation model equations, in accordance with the exposure conditions including the pattern of the reticle 109 used in actual exposure, and the result of detecting light having passed through the projection optical system 110. In other words, the exposure apparatus 1 can efficiently obtain an approximation model equation representing variations in imaging characteristic of the projection optical system 110 in actual exposure. Hence, the exposure apparatus 1 can provide a high-quality device (for example, a semiconductor device or a liquid crystal display device) with a high throughput and good economic efficiency by reducing the variations in imaging characteristic of the projection optical system 110 with high accuracy using an approximation model equation.

A method of manufacturing an article such as a device according to this embodiment can include a step of forming a pattern on an object (for example, a substrate coated with a photoresist) using the above-mentioned exposure apparatus (a step of exposing an object to light). The manufacturing method can also include a step of processing (for example, developing or etching) the object having the pattern formed on it in the forming step. The manufacturing method can moreover include subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-141468 filed on Jun. 22, 2012, which is hereby incorporated by reference herein in its entirety.

What is claimed is:

1. An exposure apparatus for exposing a substrate to light, the exposure apparatus comprising:
a projection optical system configured to project light from a reticle onto the substrate;
a processor configured to estimate a variation in imaging characteristic of the projection optical system, based on a first model equation or a second model equation; and
an adjusting device configured to adjust the imaging characteristic of the projection optical system based on the variation estimated by the processor,
wherein the processor is configured to generate, in a case where an error of the imaging characteristic of the projection optical system adjusted by the adjusting device based on the variation, which is estimated based on the first model equation including a first number of models for estimating the variation and determined in advance without the reticle, does not fall within a predetermined tolerance, the second model equation including a second number of models for estimating the variation based on the error, the second number being larger than the first number.

2. The apparatus according to claim 1, wherein the processor is configured to determine whether the error falls within the predetermined tolerance, based on information associated with a measurement value of the imaging characteristic.

3. The apparatus according to claim 1, wherein the first number of models are prepared with respect to each of a plurality of illumination conditions for the reticle.

4. The apparatus according to claim 1, wherein the imaging characteristic includes focus, magnification, distortion, astigmatism, spherical aberration, coma aberration, or wavefront aberration, or any combination thereof.

5. The apparatus according to claim 1, wherein each of the first number of models and the second number of models includes models that are different from each other in a time constant for representing the variation in imaging characteristic.

6. The apparatus according to claim 1, wherein the processor is configured to use the first number of models or the second number of models to estimate the variation in imaging characteristic during a predetermined period.

7. The apparatus according to claim 1, wherein each of the first and second number of models includes a component of the imaging characteristic, at a past time, multiplied by a function represented by a time constant, and a model not included in the first number of models and included in the second number of models is different from each of the first number of models in the component or the function or both thereof.

8. The apparatus according to claim 1, wherein a model not included in the first number of models and included in the second number of models is associated with the reticle.

9. An exposure method of exposing a substrate to light via a projection optical system configured to project light from a reticle onto the substrate, the method comprising:
   an estimating step of estimating a variation in imaging characteristic of the projection optical system based on a first model equation or a second model equation;
   an adjusting step of adjusting the imaging characteristic of the projection optical system based on the variation estimated in the estimating step; and
   a generating step of generating, in a case where an error of the imaging characteristic of the projection optical system adjusted in the adjusting step based on the variation, which is estimated based on the first model equation including a first number of models for estimating the variation and determined in advance without the reticle, does not fall within a predetermined tolerance, the second model equation including a second number of models for estimating the variation based on the error, the second number being larger than the first number.

10. A method of manufacturing an article, the method comprising the steps of:
   exposing a substrate to light using an exposure apparatus; and
   processing the exposed substrate to manufacture the article,
   wherein the exposure apparatus includes:
   a projection optical system configured to project light from a reticle onto the substrate;
   a processor configured to estimate a variation in imaging characteristic of the projection optical system, based on a first model equation or a second model equation; and
   an adjusting device configured to adjust the imaging characteristic of the projection optical system based on the variation estimated by the processor,
   wherein the processor is configured to generate, in a case where an error of the imaging characteristic of the projection optical system adjusted by the adjusting device based on the variation, which is estimated based on the first model equation including a first number of models for estimating the variation and determined in advance without the reticle, does not fall within a predetermined tolerance, the second model equation including a second number of models for estimating the variation based on the error, the second number being larger than the first number.

11. An exposure apparatus for exposing a substrate to light, the exposure apparatus comprising:
   a projection optical system configured to project light from a reticle onto the substrate;
   a processor configured to estimate a variation in imaging characteristic of the projection optical system based on a model equation; and
   an adjusting device configured to adjust the imaging characteristic of the projection optical system based on the variation estimated by the processor,
   wherein the processor is configured to generate, in a case where an error of the imaging characteristic of the projection optical system adjusted by the adjusting device based on the variation, which is estimated based on a first model equation including a first number of models for estimating the variation and determined in advance, does not fall within a predetermined tolerance, a second model equation including a second number of models for estimating the variation based on the error to estimate the variation based on the second model equation instead of the first model equation after the second model equation is generated, the second number being larger than the first number.

12. The apparatus according to claim 11, wherein the processor is configured to determine whether the error falls within the predetermined tolerance, based on information associated with a measurement value of the imaging characteristic.

13. The apparatus according to claim 11, wherein the first model equation is prepared with respect to each of a plurality of illumination conditions for the reticle.

14. The apparatus according to claim 11, wherein the imaging characteristic includes focus, magnification, distortion, astigmatism, spherical aberration, coma aberration, or wavefront aberration, or any combination thereof.

15. The apparatus according to claim 11, wherein each of the first model equation and the second model equation includes models that are different from each other in a time constant for representing the variation in imaging characteristic.

16. The apparatus according to claim 11, wherein the processor is configured to use the first model equation or the second model equation to estimate the variation in imaging characteristic during a predetermined period.

17. The apparatus according to claim 11, wherein each of the first and second model equations includes a component of the imaging characteristic, at a past time, multiplied by a function represented by a time constant, and a model not included in the first model equation and included in the second model equation is different from each of the first number of models in the component or the function or both thereof.

18. The apparatus according to claim 11, wherein a model not included in the first model equation and included in the second model equation is associated with the reticle.

19. An exposure method of exposing a substrate to light via a projection optical system configured to project light from a reticle onto the substrate, the method comprising:
   an estimating step of estimating a variation in imaging characteristic of the projection optical system based on a model equation;
   an adjusting step of adjusting the imaging characteristic of the projection optical system based on the variation estimated in the estimating step; and
   a generating step of generating, in a case where an error of the imaging characteristic of the projection optical system adjusted in the adjusting step based on the variation, which is estimated based on a first model equation including a first number of models for estimating the variation and determined in advance, does not fall within a predetermined tolerance, a second model equation including a second number of models for estimating the variation based on the error to estimate the variation based on the second model equation instead of the first model equation after the second model equation is generated, the second number being larger than the first number.

20. A method of manufacturing an article, the method comprising the steps of:
   exposing a substrate to light using an exposure apparatus; and processing the exposed substrate to manufacture the article, wherein the exposure apparatus includes:

a projection optical system configured to project light from a reticle onto the substrate;

a processor configured to estimate a variation in imaging characteristic of the projection optical system based on a model equation; and an adjusting device configured to adjust the imaging characteristic of the projection optical system based on the variation estimated by the processor, wherein the processor is configured to generate, in a case where an error of the imaging characteristic of the projection optical system adjusted by the adjusting device based on the variation, which is estimated based on a first model equation including a first number of models for estimating the variation and determined in advance, does not fall within a predetermined tolerance, a second model equation including a second number of models for estimating the variation based on the error to estimate the variation based on the second model equation instead of the first model equation after the second model equation is generated, the second number being larger than the first number.

21. An exposure apparatus for exposing a substrate to light, the exposure apparatus comprising:

a projection optical system configured to project light from a reticle onto the substrate;

a processor configured to estimate a variation in imaging characteristic of the projection optical system based on a model equation; and an adjusting device configured to adjust the imaging characteristic of the projection optical system based on the variation estimated by the processor, wherein the processor is configured to generate, in a case where, the processor determines, based on information associated with a pattern of the reticle, that an error of the imaging characteristic of the projection optical system adjusted by the adjusting device based on the variation, which is estimated based on a first model equation including a first number of models for estimating the variation and determined in advance, does not fall within a predetermined tolerance, a second model equation including a second number of models for estimating the variation, based on the error to estimate the variation based on the second model equation instead of the first model equation after the second model equation is generated, the second number being larger than the first number.

22. The apparatus according to claim 21, wherein the first model equation is prepared with respect to each of a plurality of illumination conditions for the reticle.

23. The apparatus according to claim 21, wherein the imaging characteristic includes focus, magnification, distortion, astigmatism, spherical aberration, coma aberration, or wavefront aberration, or any combination thereof.

24. The apparatus according to claim 21, wherein each of the first model equation and the second model equation includes models that are different from each other in a time constant for representing the variation in imaging characteristic.

25. The apparatus according to claim 21, wherein the processor is configured to use the first model equation or the second model equation to estimate the variation in imaging characteristic during a predetermined period.

26. The apparatus according to claim 21, wherein each of the first and second model equations includes a component of the imaging characteristic, at a past time, multiplied by a function represented by a time constant, and a model not included in the first model equation and included in the second model equation is different from each of the first number of models in the component or the function or both thereof.

27. The apparatus according to claim 21, wherein a model not included in the first model equation and included in the second model equation is associated with the reticle.

28. An exposure method of exposing a substrate to light via a projection optical system configured to project light from a reticle onto the substrate, the method comprising:

an estimating step of estimating a variation in imaging characteristic of the projection optical system based on a model equation;

an adjusting step of adjusting the imaging characteristic of the projection optical system based on the variation estimated in the estimating step; and a generating step of generating, in a case where a determination is made, based on information associated with a pattern of the reticle, that an error of the imaging characteristic of the projection optical system adjusted by the adjusting device based on the variation, which is estimated based on a first model equation including a first number of models for estimating the variation and determined in advance, does not fall within a predetermined tolerance, a second model equation including a second number of models for estimating the variation, based on the error to estimate the variation based on the second model equation instead of the first model equation after the second model equation is generated, the second number being larger than the first number.

29. A method of manufacturing an article, the method comprising the steps of:

exposing a substrate to light using an exposure apparatus; and processing the exposed substrate to manufacture the article, wherein the exposure apparatus includes:

a projection optical system configured to project light from a reticle onto the substrate;

a processor configured to estimate a variation in imaging characteristic of the projection optical system based on a model equation; and an adjusting device configured to adjust the imaging characteristic of the projection optical system based on the variation estimated by the processor, wherein the processor is configured to generate, in a case where the processor determines, based on information associated with a pattern of the reticle, that an error of the imaging characteristic of the projection optical system adjusted by the adjusting device based on the variation, which is estimated based on a first model equation including a first number of models for estimating the variation and determined in advance, does not fall within a predetermined tolerance, a second model equation including a second number of models for estimating the variation, based on the error to estimate the variation based on the second model equation instead of the first model equation after the second model equation is generated, the second number being larger than the first number.

* * * * *